United States Patent [19]

Hasegawa et al.

[11] Patent Number: 4,847,565

[45] Date of Patent: Jul. 11, 1989

[54] SOLID STATE ELECTROMAGNETIC WAVE AMPLIFIER

[75] Inventors: Hideki Hasegawa, Ebetsu; Hideo Ohno, Sapporo, both of Japan

[73] Assignee: Hokkaido University, Japan

[21] Appl. No.: 130,004

[22] Filed: Dec. 8, 1987

Related U.S. Application Data

[63] Continuation-in-part of Ser. No. 840,601, Mar. 17, 1986, abandoned.

[30] Foreign Application Priority Data

Mar. 28, 1985 [JP] Japan .................................. 60-62078

[51] Int. Cl.⁴ ............................................. H03F 3/55
[52] U.S. Cl. ......................................... 330/5; 330/250
[58] Field of Search ...................... 330/4.6, 5, 43, 250; 331/82, 107 R

[56] References Cited

U.S. PATENT DOCUMENTS

| | | | |
|---|---|---|---|
| 3,336,532 | 8/1967 | Bartelink et al. | 330/5 |
| 3,401,347 | 9/1968 | Sumi | 330/5 |
| 3,436,666 | 4/1969 | Claytor et al. | 330/5 |
| 3,551,831 | 12/1970 | Kino et al. | 330/5 |
| 3,611,192 | 10/1971 | Swartz | 330/5 X |
| 3,639,851 | 2/1972 | Diamond | 330/5 |
| 3,833,858 | 9/1974 | Gandhi et al. | 330/5 |

OTHER PUBLICATIONS

Journal of Applied Physics, vol. 46, No. 9, Sep. 1975, pp. 3925–3933, American Institute of Physics; J. Thiennot: "Traveling-Wave Amplification by Interaction with a Current in a Semiconductor".

Le Journal de Physique, vol. 33, Nos. 8/9, Aug./Sep. 1972, pp. 781–786; J. Thiennot: "L'effet de la Charge Electrique de Surface sur le Gain de L'amplificateur a onde Progressive a l'etat Solide".

Primary Examiner—James B. Mullins
Attorney, Agent, or Firm—Silverman, Cass, Singer & Winburn, Ltd.

[57] ABSTRACT

A solid state electromagnetic wave amplifier is provided with confinement structures for the prevention of transverse carrier wave diffusion into the amplifier body. The carrier waves are confined with a non-metallic semiconductor layer sandwiched between a semi-insulating substrate and a spacer insulating layer. The amplifier can operate at frequencies up to on the order of 100 GHz.

10 Claims, 4 Drawing Sheets

SOLID STATE ELECTROMAGNETIC WAVE AMPLIFIER

This is a continuation-in-part of application Ser. No. 840,601, filed Mar. 17, 1986, now abandoned.

BACKGROUND OF THE INVENTION

1. Field of the Invention

The present invention relates generally to electromagnetic wave amplifiers and more particularly to a solid state electromagnetic wave amplifier used in the amplification of ultra high frequency electromagnetic waves at operating frequencies on the order of up to about 100 GHz.

2. Prior Art

The recent and remarkable development of Si-integrated circuits, has made the rapid processing of information available in all facets of modern life. New applications for this technology are constantly increasing, as is the demand for larger capacity, faster acting circuits which operate at high frequencies. This imposes a requirement for amplifiers capable of operating in a range up to the ultra high frequency. Furthermore, the trend in the electronics industry has been to incorporate more solid state components. At present, there still are two applications for vacuum tubes, which cannot be substituted for by solid state electronic elements. One is the Brown tube used for displays and the other is in ultra high frequency high power vacuum tubes such as the traveling wave tube. The latter utilizes the interaction between electrons traveling in a vacuum and the delayed wave of the electromagnetic field to produce a substantially higher power than produced by conventional tubes. This results because the interaction between the electrons and the electromagnetic field is not limited to a very small space like that of a triode tube, but the interaction is carried out across a broad surface with the propagation of the electromagnetic wave.

The traveling wave type amplification is expected to produce the same effects in its solid state version as compared with field effect devices. For this reason, solid state type traveling wave amplifiers have long been suggested as being desirable. Nevertheless, until the present invention, such amplifiers have not been reduced to practice.

The failure of the prior art is due to the fact that in conventional solid state type amplifiers using the interaction between the carrier wave of electrons of holes in the solid bulk material and the electromagnetic wave, the amplitude of the carrier wave which interacts with the electromagnetic field is decreased by the transverse diffusion of the carrier wave into the bulk of the solid body so that a sufficient interaction is not realized.

Accordingly, an invention of a solid state type electromagnetic wave amplifier having a structure capable of preventing such diffusion might enable one to achieve the hitherto unrealized solidification of ultra high frequency high power devices. Such a device may contribute to the miniaturization and weight reduction of microwave communication and radar equipment and may lead to drastic expansion of applicable fields such as microwave techniques.

SUMMARY OF THE INVENTION

The above and other disadvantages of the prior art are overcome in accordance with the present invention by providing a structure which prevents transverse diffusion of the carrier wave and provides a solid state electromagnetic wave amplifier able to amplify the electromagnetic wave super high frequencies up to on the order of 100 GHz. The transverse diffusion is prevented by utilizing a thin film semiconductor material, a multi-potential barrier or confinement by action of the electric field.

DESCRIPTION OF THE PREFERRED EMBODIMENTS

The invention is designed to overcome the loss resulting from the decrease in amplitude of carrier waves interacting with electromagnetic waves by diffusion into the semiconductor layer, by utilizing a novel carrier wave diffusion preventing structure in forming a solid electromagnetic wave amplifier.

Figure 1:
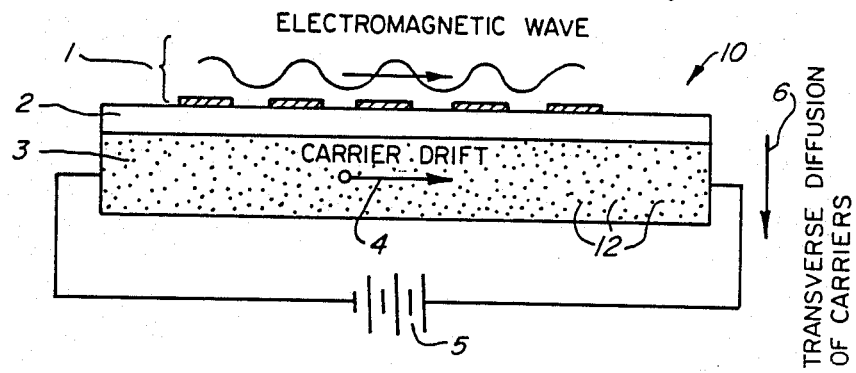
FIG. 1 is a sectional diagram of a conventional prior art solid state traveling wave amplifier.

Referring now to the drawings, FIG. 1 is a schematic cross-sectional diagram of a conventional solid-state traveling wave amplifier designated generally by the numeral 10. In FIG. 1, a slow-wave electromagnetic waveguide 1 provides a delayed electromagnetic field of the amplifier 10. The waveguide 1 can be created by forming a meandered, interdigital, planarized helix or other planar slow-wave structure. The amplifier 10 includes a semiconductor layer or body 3 where a plurality of carriers 12 (electrons or holes) are drifting as indicated by an arrow 4 under the influence of an applied electric field provided by a power supply 5. A spacer layer 2 is located between the semiconductor 3 and the electromagnetic waveguide 1. The spacer layer 2 is composed of an insulating dielectric or a semiinsulating semiconductor material. The present invention is concerned with the structure of the semiconductor layer 3, together with its supporting and surrounding structure, which are designed to sufficiently reduce the transverse diffusion effect of the carriers 12. The direction of transverse diffusion in the amplifier 10 of the carriers 12 is indicated by an arrow 6.

In the types of semiconductor structure similar to that shown in FIG. 1, it is known that a strong interaction is expected to take place between the carriers 12 and the electromagnetic wave when the drift velocity of the carriers is close to the propagation velocity of the electromagnetic wave. Amplification of the electromagnetic wave results when the drift velocity exceeds the velocity of the uninteracted electromagnetic wave. The amplification mechanism can be explained in the following way. The electromagnetic wave induces a carrier wave which causes a spatial and time variation of carrier density within the semiconductor layer 3. The carrier wave travels at the drift velocity. When the drift velocity of this carrier wave exceeds the velocity of the uninteracted electromagnetic wave, energy is supplied from the kinetic motion of carriers to the electromagnetic wave to maintain the overall synchronization. Thus, the amplitude and phase of this carrier wave play a central role in the traveling wave interaction.

The present invention is based on the finding that the amplitude of the carrier wave decays from the surface of the semiconductor 3 adjacent the layer 2, towards the interior of the semiconductor 3 due to transverse diffusion of the carriers 12 as indicated by the arrow 6 in FIG. 1. Thus, the optimum carrier wave net density exists only within a thin surface layer or region of the semiconductor body 3. Diffusion of the carriers 12 into the region beneath this surface layer does not contribute to the traveling wave interaction, but it does increase power consumption caused by the carrier drift and reduces the conversion efficiency of the amplifier 10. The thickness of this desirable active surface layer is given by the Debye's screening length as explained below.

In previously proposed prior art solid state traveling wave amplifiers using semiconductors, the semiconductor layer 3 in FIG. 1 is designed to be a uniform semiconductor slab of arbitrary thickness supported either by itself or by an oppositely conducting semiconductor substrate utilizing a p-n junction. Previously, no consideration or restriction whatsoever had been given to the thickness of the active semiconductor portion 3 in the prior art designs.

The present invention is intended to inhibit or remove the carrier diffusion phenomenon by utilizing one or more of the following three techniques:

(1) the use of thin film of semiconductor material of an appropriate thickness embedded in an insulating material to suppress transverse diffusion;
(2) the use of a multi-potential barrier for carrier wave confinement; or
(3) the use of an electric field to provide the confinement action.

The invention provides gain, bandwidth and conversion efficiency enhancements to a solid state amplifier. The invention will now be described by referring to FIGS. 2-7 of the accompanying drawings. The embodiments show various physical concepts of the invention and it should be noted that the invention may have various modifications and improvements in a range without departing the spirit of the present invention.

Figure 2:
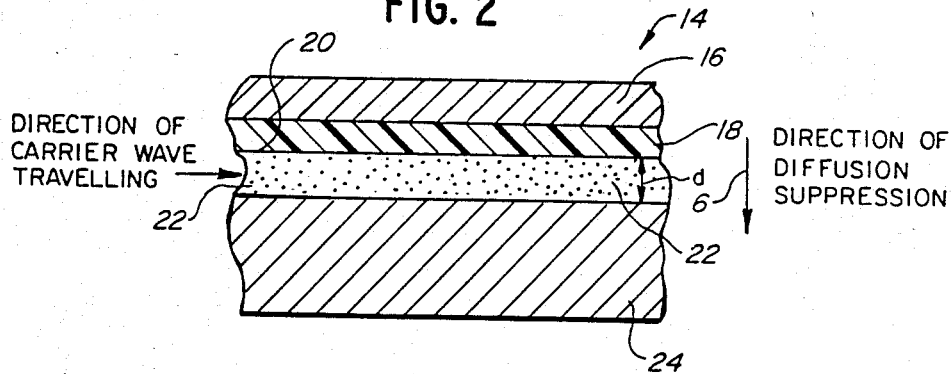
FIG. 2 is a cross section view of a solid state amplifier of the invention depicting the principle of prevention of carrier wave diffusion using a semiconductor film of optimum thickness.

FIG. 2 shows a first amplifier embodiment of the invention designated by a reference numeral 14. A slow-wave electromagnetic waveguide 16 is formed on a spacer insulating film 18 for separating and protecting a semiconductor surface 20 of a semiconductor film or layer 22. The thin semiconductor film 22 is formed of an appropriate thickness for producing the carrier wave with suppressed carrier diffusion and is formed on a semi-insulating substrate 24 for supporting the thin semiconductor film 22.

The thickness "d" of the semiconductor film 22 has an appropriate value depending on its carrier concentration as explained herein below. The semiconductor film 22 essentially is embedded in the insulating film or media 18 to avoid losses caused by stagnant carriers. It should be noted that the conventional p-n junction cannot be utilized for the purpose of embedding the active semiconductor film 22 because of the presence of stagnant carriers of opposite polarity which cause serious efficiency loss.

The present structure can be realized by growth of an epitaxial layer 22 with an optimum thickness of GaAs or InP or related mixed crystals thereof on the semi-insulating layer 24 formed of GaAs, InP or other type of substrate 24 with or without an epitaxial buffer layer (not illustrated) to form the semiconductor layer 22 followed by formation of a suitable insulator layer 18 on top of the surface 20 as the spacer. Epitaxial semi-insulating semiconductor layers with sufficient resistivity, such as undoped or compensated AlGaAs also can be utilized as the spacer layer 18. The present structure can also be realized in Si technology by utilizing, for instance, epitaxial growth of Si to form the layer 22 on sapphire which forms the layer 24, followed by thermal oxidation of Si to form the spacer layer 18.

In this configuration 14, the transverse diffusion 6 of the carrier wave is suppressed since the thin semiconductor layer or film 22 has a definite optimized thickness d as described hereinafter.

Figure 3:
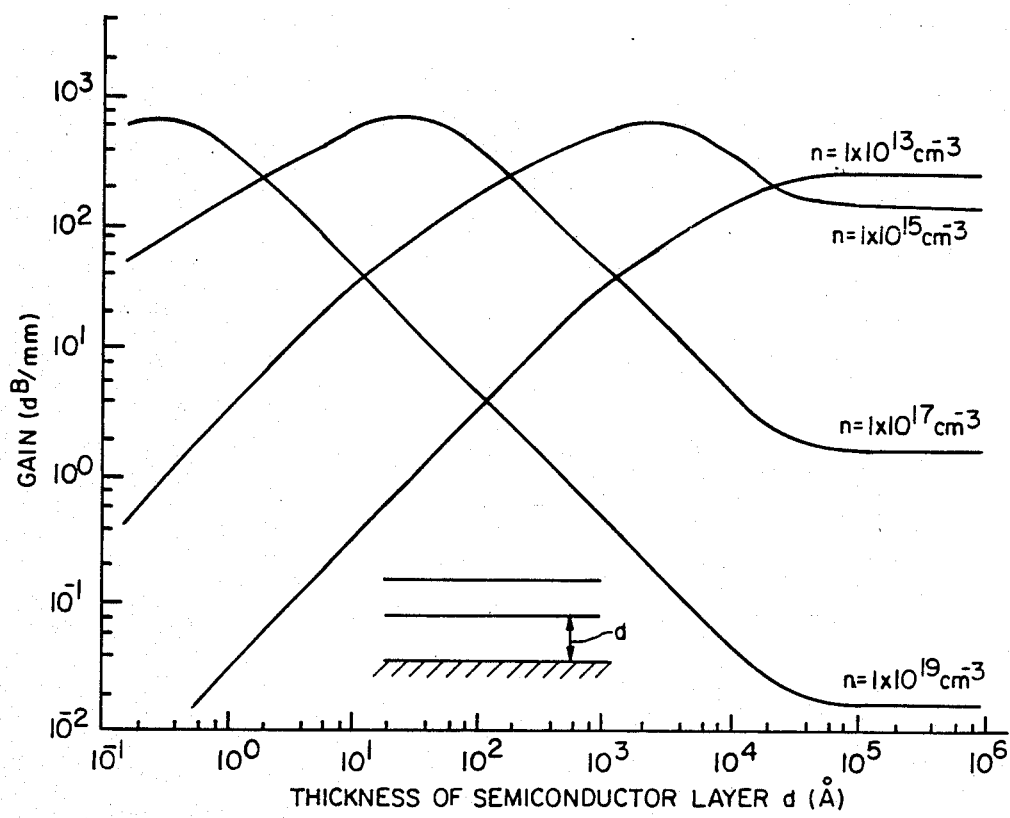
FIG. 3 is a diagram showing the effect of carrier confinement in preventing carrier wave diffusion.

A practical embodiment of losses caused by the diffusion of the carrier wave in the semiconductor layer 22 is illustrated in FIG. 3. In the FIG. 2 configuration 14, transverse diffusion of the carriers 12 can be suppressed if the thickness d of the semiconductor film 22 is optimized as indicated in FIG. 3.

FIG. 3 illustrates the relationship between the gain (ordinate) and the thickness d of the semiconductor (abscissa), and reflects calculations made for a structure 14, such as shown in FIG. 2, having a uniform semiconductor film 22 of thickness d embedded in an insulating or semiinsulating media 18. The slow-wave electromagnetic wavegude 16 is assumed to be an idealized planar helix structure. The calculation was performed utilizing the transverse impedance matching method.

As can be seen clearly from the drawing, if the thickness of the semiconductor layer 22 is larger than the Debye's screening length $L_D$, the magnitude of the attenuation caused from the diffusion of the carrier wave becomes large and the magnitude of the gain decreases significantly. Herein, the term Debye's screening length $L_D$ is defined by the following equation:

$$L_D = \frac{\sqrt{\epsilon kT}}{q^2 n}$$

wherein;
$\epsilon$ = dielectric constant (13 $\epsilon_0$)
k = Boltzmann constant
T = absolute temperature
q = unit charge
n = carrier density.

The thickness d of the thin semiconductor film 22 is preferred to be in an order of the Debye's screening length $L_D$ as has been explained with respect to FIG. 3. Furthermore, the thin semiconductor film 22 used in this regard is preferred to have a high carrier mobility in order to raise the efficiency of the amplification. It is preferred to utilize a semiconductor compound typically represented by GaAs and InP or mixed crystals thereof. However, Si may be used in view of its highly established processing technique.

On the other hand, it is also clear that there exists an optimum thickness d of the semiconductor film 22 at which the gain becomes maximum. The reason for existence of such an optimum is clear because, when the thickness d of the semiconductor layer 22 is too small, the number of carriers 12 taking part in amplification is too small, whereas the effect of transverse diffusion becomes two severe when the thickness d is too large. The optimum thickness has a value close to the Debye's screening length, although its exact values should be determined specifically for a particular amplifier design depending on the electromagnetic waveguide structure and amplifier configuration. When the optimum thickness d is used, the entire thickness is utilized for excitation of carrier wave, and thus the gain, bandwidth and conversion efficiency of the ammplifier are enhanced. Such enhancement is common to other confinement structures of the present invention explained hereinafter.

Figure 4:
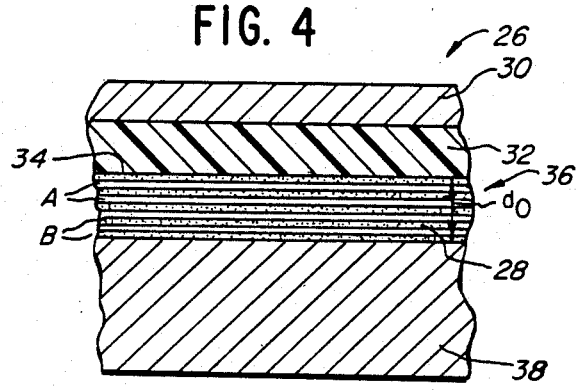
FIG. 4 is a cross section view of a solid state amplifier of the invention utilizing a structure for preventing carrier wave diffusion using heterojunctions.

FIG. 4 depicts an amplifier embodiment 26 in which a multi-potential barrier 28 is utilized to contain transverse carrier wave diffusion. Here, the discontinuity of the band at each of the plurality of heterojunctions between two different semiconductor materials A and B is utilized as the barrier for confinement. A heterojunction refers to a junction formed by two different materials shown as the material A alternating with the material B in FIG. 4, where discontinuity of the multi-potential barrier 28 produces the barrier against carrier diffusion.

Figure 4A:
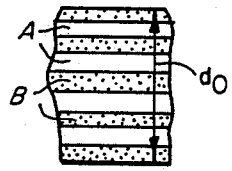
FIG. 4A is a slightly enlarged portional cross section view of the heterojunctions depicted in FIG. 4.

In FIGS. 4 and 4A, an electromagnetic waveguide 30 is formed on a spacer insulating film 32 for protecting a semiconductor surface 34 on the multi-potential semiconductor barrier 28 which forms a semiconductor body 36 having the plurality of heterojunctions for producing the carrier wave. A semi-insulating semiconductor substrate 38 is formed for supporting the semiconductor body 36, and $d_0$ is the thickness of the semiconductor body 36 having the heterojunctions.

Figure 5:
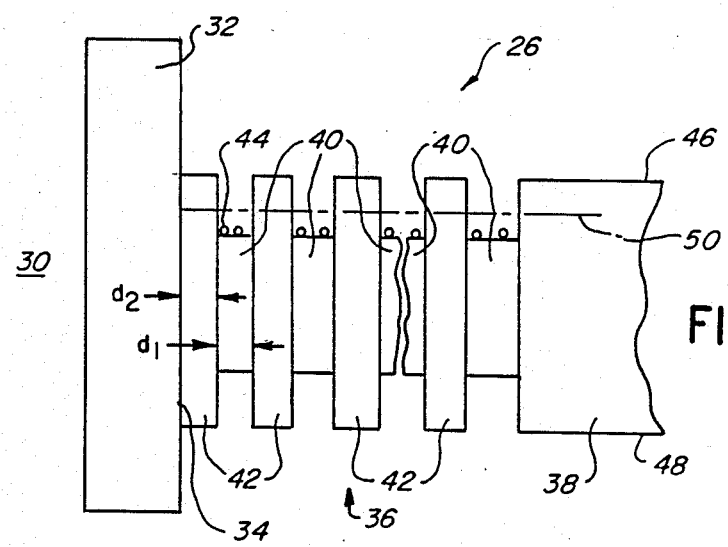
FIG. 5 is an enlarged diagrammatic view of the semiconductor layer depicted in FIG. 4 rotated 90°.

FIG. 5 illustrates the potential distribution in the direction of the thickness $d_0$ of the structure 26 of FIG. 4. In FIG. 5, the electromagnetic waveguide 30, the insulating film 32 for protecting the semiconductor surface 34 and the multi-potential barrier semiconductor body 36 are formed on the semi-insulating substrate 38 for supporting the thin semiconductor layers. The waveguide 30 is illustrated on edge or rotated 90° from FIG. 4. The body 36 is formed by a low potential semiconductor layer 40 having a thickness $d_1$ and a high potential semiconductor layer 42 having a thickness $d_2$ alternating with the layer 40 forming the heterojunctions therebetween. A plurality of electrons 44 are illustrated. A line indicated by the reference numeral 46 is the lower edge of the conductuon band of the semiconductor 36, a line 48 indicates the upper end of the valence band of the semiconductor 26 and a line 50 indicates the Fermi level of the device 26.

In this structure 26, the carriers 44 are confined within the three respective low potential semiconductor layers 40 through the barrier provided by the heterojunctions formed by the adjacent layer 42. The thickness $d_1$ of the low potential semiconductor layers 40 is chosen to be substantially equal to or less than the Debye's screening length to suppress the transverse diffusion of the carriers 44.

It is preferred to arrange the body 16 in a multi-layer construction by stacking a plurality of the layers 40 and 42 as shown in FIG. 4 and by making the thickness of each layer sufficiently thin so as to increase both the gain and bandwidth of the device. Although the number of the high and low potential layers and their thicknesses depend on the specific amplifier design, the thickness $d_1$ of the low potential semiconductor layers is chosen to be nearly equal to or less than the Debye's screening length so as to suppress transverse diffusion of carriers. In this case, the sum of thicknesses $d_1$ of the stacked layers 40 may very well exceed the Debye's screening length and the thickness $d_2$ of the high potential layers 42 is preferred to be as thin as possible, but not so thin that the carriers can move therethrough by the tunneling effect. Furthermore, the thickness of each low potential or high potential layer 40, 42 in the stacked structure 26 can be made different in accordance with the specific requirement on gain and bandwidth of the amplifier.

The present invention can be realized, for instance, by alternate growth of GaAs layers (as material A in FIG. 4) and AlGaAs layers (as material B in FIG. 4) by standard expitaxial growth techniques, such as molecular beam epitaxy or organometallic vapor phase epitaxy on top of a semiinsulating GaAs substrate 38. A variety of other material combinations of InAs/GaSb and InP/GaInAs are possible. With the advance of the so-called SOI (semiconductor-on-insulator) growth technique, the high potential material can be an insulator such as $SiO_2$, resulting, for instancce, in an $Si/SiO_2$ multi-layer structure. It is preferable to use a high mobility material such as GaAs, InP or the related mixed compounds thereof, as the low potential semiconductor layer. In this connection, a so-called selective doping structure may be utilized where doping is done selectively in the high potential material only and the carriers therefrom move into the undoped low potential material.

Figure 6:
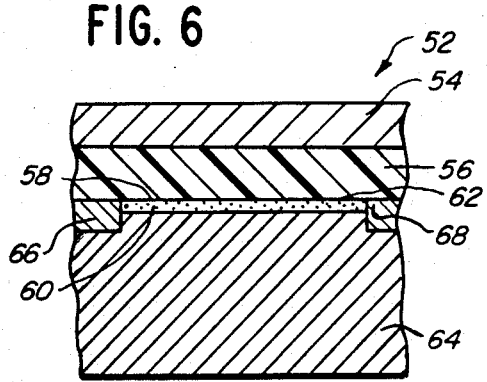
FIG. 6 is a cross-section view of an alternate embodiment of the invention utilizing electric field confinement.

FIG. 6 is an amplifier embodiment 52 utilizing the confinement action of an electric field. In FIG. 6, an electromagnetic waveguide 54 designates the slow-wave electromagnetic field interacting with the carrier wave and an insulating film 56 is formed for protecting a semiconductor surface 58 on a semiconductor layer 60. The electric field through the spacer layer 56 forms a channel layer 62 for accumulating (inverting) carriers at the surface 58 of the semiconductor 60 formed on a semiconductor substrate 64. The resistivity of the semiconductor substrate 64 should be high enough to make the stagnant carriers present in the substrate 64 to cause negligible microwave loss. The substrate 64 can include a highly resistive expitaxial layer of the same or a different material on its top, so that the carriers are induced in this high quality epitaxial region. A pair of highly doped regions 66 and 68 are designed to make contact with the channel layer 62 from an external power supply (not shown). The basic principle of the structure of FIG. 6 is to induce a layer of carriers by the electric field as is done in MOS (metal-oxide-semiconductor) transistors. The thickness of such a layer of field induced carriers, which is normally called the channel layer, can be made thinner than the Debye's length due to the confinement action of the electric field. In this embodiment, the channel layer 62 is utilized for the purpose of traveling wave amplification with suppressed transverse diffusion. The electric field to induce carriers can be produced either by applying a voltage between the external metal gate electrode and the semiconductor substrate 64 or by embedding suitable ion species into the spacer layer 56. The metal electrode pattern of the slow-wave electromagnetic wave guide may be used as the external gate partially or as a whole depending on the pattern structure.

Figure 7:
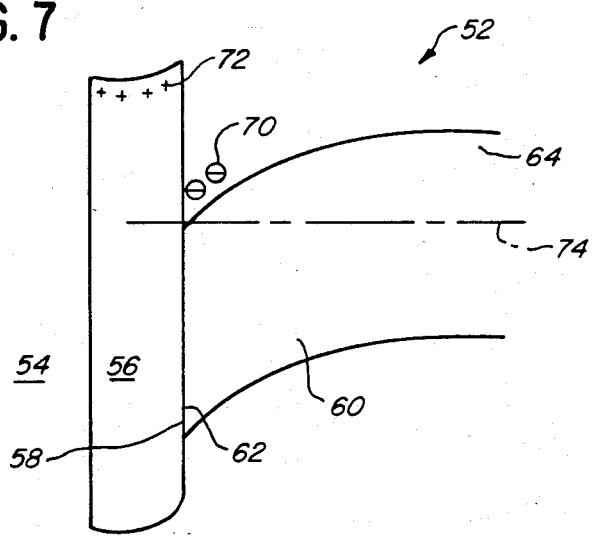
FIG. 7 is an explanatory diagram showing the potential distribution along the direction of the depth of the structure shown in FIG. 6.

FIG. 7 illustrates the potential distribution along the depth of the structure 52 of FIG. 6. Referring to FIGS. 6 and 7, the electromagnetic waveguide 54 includes the insulating film 56 for protecting the semiconductor surface 58 and for forming the channel layer 62. The channel layer 62 accumulates (inverts) carriers 70 at the surface 58 of the semiconductor 60. The film 56 includes positive ions 72 caused by doping in the insulating film 56 for forming the accumulating layer at the surface 58 of the semiconductor 60 (in this regard, it is also possible to use gate electrodes for forming the accumulating layer). The Fermi level of the structure 52 is designated by the numeral 74.

In this structure 52, the electrons 70 in the accumulating layer 62 formed in the surface 58 of the semiconductor 60 are confined by the electric field in the semiconductor substrate 64 produced from the positive ions 72 in FIG. 7, by the insulating film 56 and by the potential barrier in the semiconductor substrate 64, namely the electrons 70 are confined in a very narrow region and the diffusion into the bulk of the semiconductor 64 is suppressed.

The embodiment 52 can be realized by forming the insulator spacer layer 56 on a semi-insulating or highly resistive semiconductor substrate 64 with or without an epitaxial top layer of a high resistivity. The polariy and amount of ions embedded in the insulator layer 56 can be adjusted by the insulator formation process. A high quality semi-insulating semiconductor layer may also be used as the insulating spacer layer. It is preferable to use a high mobility material such as GaAs, InP or the related mixed crystal material in the channel region 62. In this connection, the so-called selective doping heterojunction structure may be employed in this embodiment, where doping is done selectively in the high potential material utilized as the spacer 56 or as a portion of the underlying substrate 64 and the carriers therefrom move into the undoped low potential material used as the channel material. The electric field produced by the ionized doners confines the carriers in the channel 62.

The present invention is designed to overcome the loss due to attenuation of the amplitude of the carrier wave interacting with the electromagnetic wave by the diffusion of carriers into the semiconductor by introducing a structure for the confinement of the carrier wave.

The invention uses the following three types of confinement embodiments:
  (1) a semiconductor film of optimized thickness embedded in insulating media;
  (2) a multi-potential barrier to carrier wave diffusion formed by heterojunctions; or
  (3) induction of confined carriers by the electric field.

Modifications and variations of the present invention are possible in light of the above teachings. It is therefore to be understood that within the scope of the appended claims, the invention may be practiced otherwise than as specifically described.

What is claimed and desired to be secured by Letters Patent of the United States is:

1. In a solid state semiconductor type electromagnetic wave amplifier based on traveling wave interaction between a carrier wave and an electromagnetic wave, the improvement comprising:
  means for suppressing the power loss caused by the transverse diffusion of carriers in said amplifier for operating frequencies up to on the order of 100 GHz, said suppressing means including a semi-insulating substrate with an upper surface and a non-metallic layer forming a barrier having an upper surface, a thickness on the order of Debye's screening length, and a lower surface integrally joined to said upper surface of said substrate, said barrier formed to prevent carrier diffusion into said substrate;
  a spacer insulating layer having an upper surface and integrally joined to said upper surface of said barrier to separating and protecting said barrier; and
  a slow-wave electronic waveguide integrally joined to said upper surface of said spacer insulating layer.

2. A solid state semiconductor type electromagnetic wave amplifier based on traveling wave interaction between a carrier wave and an electromagnetic wave and capable of operating at frequencies up to on the order of 100 GHz comprising:
  means for suppressing the power loss caused by the transverse diffusion of carriers in said amplifier, said suppressing means including a semi-insulating substrate with an upper surface and a non-metallic multi-potential barrier having an upper surface and including a plurality of heterojunctions comprised of alternating layers of a low potential material and a high potential material, each of said layers having a thickness, the thickness of each of said low potential materials being less than or equal to Debye's screening length;
  a spacer insulating layer having an upper surface and integrally joined to said upper surface of waid barrier for separating and protecting said barrier; and
  a slow-wave electronic waveguide integrally joined to said upper surface of said spacer insulating layer.

3. A solid state semiconductor type electromagnetic wave amplifier based on traveling wave interaction between a carrier wave and an electromagnetic wave comprising:
  means for suppressing the power loss caused by the transverse diffusion of carriers in said amplifier, said suppressing means including a semi-insulating substrate with an upper surface and a non-metallic multi-potential barrier having an upper surface, a thickness and a lower surface integrally joined to said upper surface of said substrate, said barrier being formed by a plurality of heterojunctions of two different alternating materials to prevent carrier wave diffusion into said substrate;
  a spacer insulating layer having an upper surface and integrally joined to said upper surface of said barrier for separating and protecting said barrier; and
  a slow-wave electronic waveguide integrally joined to said upper surface of said spacer insulating layer.

4. The amplifier as defined in claim 3 wherein said two different materials include a low potential material and a high potential material, each of said materials provided in a distinct layer having a thickness.

5. The amplifier as defined in claim 4 wherein said materials are formed into a sandwich made up of multiple alternating layers of said high potential material and said low potential material.

6. The amplifier as defined in claim 5 wherein said thickness of each of said low potential layers is less than or equal to Debye's screening length.

7. The amplifier as defined in claim 4 wherein the materials are semiconductors.

8. The amplifier as defined in claim 4 wherein the high potential material is an insulator and the low potential material is a semiconductor.

9. A solid state semiconductor type electromagnetic wave amplifier based on traveling wave interaction between a carrier wave and an electromagnetic wave comprising:
   means for suppressing the power loss caused by the transverse diffusion of carriers in said amplifier, said suppressing means including a semi-insulating substrate with an upper surface and a non-metallic barrier having an upper surface, a thickness on the order of Debye's screening length and a lower surface integrally joined to said upper surface of said substrate, said barrier formed to prevent carrier wave diffusion into said substrate;
   a spacer insulating layer having an upper surface and integrally joined to said upper surface of said barrier for separating and protecting said barrier; and
   a slow-wave electronic waveguide integrally joined to said upper surface of said spacer insulating layer.

10. A solid state semiconductor type electromagnetic wave amplifier based on traveling wave interaction between a carrier wave and an electromagnetic wave comprising:
   means for suppressing the power loss caused by the transverse diffusion of carriers in said amplifier, said suppressing means including a semi-insulating substrate with an upper surface and a non-metallic barrier having an upper surface, a thickness and a lower surface integrally joined to said upper surface of said substrate, said barrier formed to prevent carrier wave diffusion into said substrate and being a multi-potential barrier in the region where carriers exist and spatially separated carriers to decrease diffusion;
   a spacer insulating layer having an upper surface and integrally joined to said upper surface of said barrier for separating and protecting said barrier; and
   a slow-wave electronic waveguide integrally joined to said upper surface of said spacer insulating layer.

* * * * *

UNITED STATES PATENT AND TRADEMARK OFFICE
CERTIFICATE OF CORRECTION

PATENT NO. : 4,847,565
DATED : July 11, 1989
INVENTOR(S) : Hideki Hasegawa and Hideo Ohno It is certified that error appears in the above-identified patent and that said Letters Patent is hereby corrected as shown below:

Column 2, line 1 "wave" should be --waves--;

Column 8, line 16 "to" should be --for--;

Column 8, line 36 "waid" should be --said --.

Signed and Sealed this

Thirty-first Day of July, 1990

*Attest:*

HARRY F. MANBECK, JR.

*Attesting Officer*     *Commissioner of Patents and Trademarks*